United States Patent
Wang et al.

(10) Patent No.: US 11,664,455 B2
(45) Date of Patent: May 30, 2023

(54) WRAP-AROUND BOTTOM CONTACT FOR BOTTOM SOURCE/DRAIN

(71) Applicant: INTERNATIONAL BUSINESS MACHINES CORPORATION, Armonk, NY (US)

(72) Inventors: Junli Wang, Slingerlands, NY (US); Alexander Reznicek, Troy, NY (US); Ruilong Xie, Niskayuna, NY (US); Bruce B. Doris, Hartsdale, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/583,721

(22) Filed: Jan. 25, 2022

(65) Prior Publication Data
US 2022/0149188 A1 May 12, 2022

Related U.S. Application Data

(62) Division of application No. 16/855,777, filed on Apr. 22, 2020, now Pat. No. 11,251,304.

(51) Int. Cl.
*H01L 29/76* (2006.01)
*H01L 29/94* (2006.01)
(Continued)

(52) U.S. Cl.
CPC .... *H01L 29/785* (2013.01); *H01L 21/823418* (2013.01); *H01L 21/823431* (2013.01);
(Continued)

(58) Field of Classification Search
CPC ........... H01L 29/785; H01L 21/823418; H01L 21/823431; H01L 29/0653; H01L 29/41791; H01L 29/6653; H01L 29/66553; H01L 29/6656; H01L 29/66795; H01L 29/7845; H01L 29/7851; H01L 2029/7858;
(Continued)

(56) References Cited

U.S. PATENT DOCUMENTS 9,685,374 B1 6/2017 Lin et al.
9,735,253 B1 8/2017 Bi et al.
(Continued)

OTHER PUBLICATIONS

List of IBM Patents or Patent Applications Treated as Related dated Jan. 25, 2022, 2 pages.

*Primary Examiner* — Theresa T Doan
(74) *Attorney, Agent, or Firm* — Tutunjian & Bitetto, P.C.; Robert Sullivan

(57) ABSTRACT

A method of forming a vertical transport fin field effect transistor device is provided. The method includes replacing a portion of a sacrificial exclusion layer between one or more vertical fins and a substrate with a temporary inner spacer. The method further includes removing a portion of a fin layer and the sacrificial exclusion layer between the one or more vertical fins and the substrate, and forming a bottom source/drain on the temporary inner spacer and between the one or more vertical fins and the substrate. The method further includes replacing a portion of the bottom source/drain with a temporary gap filler, and replacing the temporary gap filler and temporary inner spacer with a wrap-around source/drain contact having an L-shaped cross-section.

20 Claims, 10 Drawing Sheets

(51) Int. Cl.
*H01L 29/78* (2006.01)
*H01L 29/66* (2006.01)
*H01L 29/06* (2006.01)
*H01L 21/8234* (2006.01)
*H01L 29/417* (2006.01)

(52) U.S. Cl.
CPC .... *H01L 29/0653* (2013.01); *H01L 29/41791* (2013.01); *H01L 29/6653* (2013.01); *H01L 29/6656* (2013.01); *H01L 29/66553* (2013.01); *H01L 29/66795* (2013.01); *H01L 29/7845* (2013.01); *H01L 29/7851* (2013.01); *H01L 2029/7858* (2013.01)

(58) Field of Classification Search
CPC ........... H01L 27/1248; H01L 29/41741; H01L 29/66666; H01L 29/7827
USPC .......................................... 257/401; 438/212
See application file for complete search history.

(56) References Cited

U.S. PATENT DOCUMENTS

| | | | |
|---|---|---|---|
| 9,773,913 | B1 | 9/2017 | Balakrishnan et al. |
| 9,805,935 | B2 | 10/2017 | Anderson et al. |
| 9,960,272 | B1 | 5/2018 | Bao et al. |
| 10,103,247 | B1 | 10/2018 | Xie et al. |
| 10,236,292 | B1 | 3/2019 | Frougier et al. |
| 2010/0295024 | A1* | 11/2010 | Pernel ............... H01L 21/02653 257/E29.245 |
| 2016/0027870 | A1* | 1/2016 | Cheng ............... H01L 29/66545 438/157 |
| 2017/0373159 | A1 | 12/2017 | Cheng et al. |
| 2018/0006118 | A1 | 1/2018 | Mallela et al. |
| 2018/0090582 | A1 | 3/2018 | Adusumilli et al. |

* cited by examiner

WRAP-AROUND BOTTOM CONTACT FOR BOTTOM SOURCE/DRAIN

BACKGROUND

The present invention generally relates to improved contacts to source/drains, and more particularly to wrap-around contacts for bottom source/drains of vertical transport fin field effect transistors (VT FinFETs).

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are coupled together.

SUMMARY

In accordance with an embodiment of the present invention, a method of forming a vertical transport fin field effect transistor device is provided. The method includes replacing a portion of a sacrificial exclusion layer between one or more vertical fins and a substrate with a temporary inner spacer. The method further includes removing a portion of a fin layer and the sacrificial exclusion layer between the one or more vertical fins and the substrate, and forming a bottom source/drain on the temporary inner spacer and between the one or more vertical fins and the substrate. The method further includes replacing a portion of the bottom source/drain with a temporary gap filler, and replacing the temporary gap filler and temporary inner spacer with a wrap-around source/drain contact having an L-shaped cross-section.

In accordance with another embodiment of the present invention, a vertical transport fin field effect transistor device is provided. The device includes a wrap-around source/drain contact on a substrate, and a bottom source/drain on the substrate and wrap-around source/drain contact. The device further includes a vertical fin on the bottom source/drain, and a gate structure on the vertical fin. The device further includes a top source/drain on the vertical fin, and a bottom source/drain contact on and in electrical contact with the wrap-around source/drain and bottom source/drain, wherein the wrap-around source/drain reduces electrical resistance between the bottom source/drain contact and bottom source/drain.

In accordance with yet another embodiment of the present invention, a vertical transport fin field effect transistor device is provided. The device includes a wrap-around source/drain contact on a substrate, and a bottom source/drain on the substrate and wrap-around source/drain contact. The device further includes a vertical fin on the bottom source/drain, and a top spacer layer on the bottom source/drain and vertical fin. The device further includes a gate dielectric layer on the bottom spacer layer and vertical fin, and a conductive gate layer on the gate dielectric layer. The device further includes a top source/drain on the vertical fin, and a bottom source/drain contact on and in electrical contact with the wrap-around source/drain and bottom source/drain, wherein the wrap-around source/drain reduces electrical resistance between the bottom source/drain contact and bottom source/drain.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a wrap-around contact for a bottom source/drain of a vertical transport fin field effect transistor device. The wrap-around contact reduces source/drain resistance and improves device performance. There can be less electrical resistance between a wrap-around source/drain contact and bottom source/drain compared to a conductive source/drain contact being directly on and in contact with a bottom source/drain.

Embodiments of the present invention provide a method of fabricating a wrap-around contact for a bottom source/drain of a vertical transport fin field effect transistor device by removing temporary spacers adjacent to the bottom source/drain to form wrap around channels, and filling the channels with a conductive material. The wrap-around contact can surround the bottom source/drain of a VT FinFET. The wrap-around contact can be formed after a high-k material reliability anneal is conducted to avoid silicide degradation.

Exemplary applications/uses to which the present invention can be applied include, but are not limited to:

It is to be understood that aspects of the present invention will be described in terms of a given illustrative architecture; however, other architectures, structures, substrate materials and process features and steps can be varied within the scope of aspects of the present invention.

Figure 1:
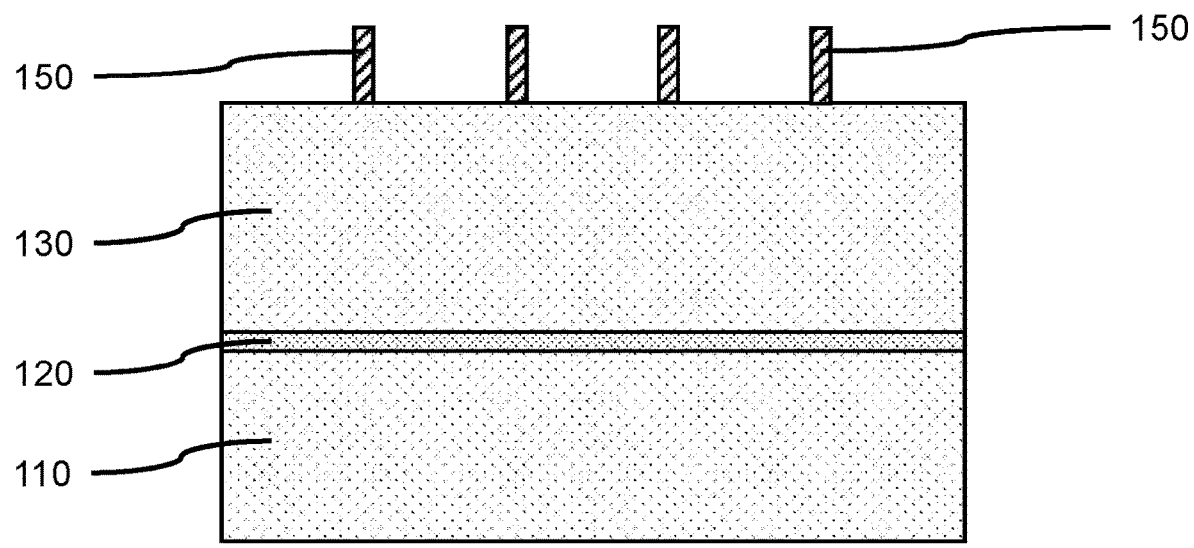
FIG. 1 is a cross-sectional side view showing a sacrificial exclusion layer on a substrate, a fin layer on the sacrificial exclusion layer, and a plurality of fin templates on the fin layer, in accordance with an embodiment of the present invention.

Referring now to the drawings in which like numerals represent the same or similar elements and initially to FIG. 1, a cross-sectional side view of a sacrificial exclusion layer on a substrate, a fin layer on the sacrificial exclusion layer, and a plurality of fin templates on the fin layer is shown, in accordance with an embodiment of the present invention.

In one or more embodiments, the substrate 110 can be a semiconductor substrate (e.g., a monolithic semiconductor wafer) or a semiconductor-on-insulator (SeOI) substrate, including, an active semiconductor surface layer, a buried insulator layer, and a carrier or support layer. One or more semiconductor devices can be formed on or in the substrate 110.

In various embodiments, the substrate 110 can include a semiconductor material, including, but not limited to, a group IV semiconductor (e.g., silicon (Si), germanium (Ge), a compound IV-IV semiconductor (e.g., silicon-germanium (SiGe), silicon carbide (SiC), a compound III-V semiconductor (e.g., gallium-arsenide (GaAs), gallium nitride (GaN), indium phosphide (InP), Indium gallium nitride (InGaN), aluminum gallium phosphide (AlGaP), etc.), a compound II-VI semiconductor (e.g., zinc selenide (ZnSe), zinc oxide (ZnO), cadmium sulfide (CdS), cadmium telluride (CdTe), etc.), and combinations thereof.

In one or more embodiments, a sacrificial exclusion layer 120 can be formed on the substrate 110, where the sacrificial exclusion layer 120 can be formed by epitaxial growth on the substrate surface. The sacrificial exclusion layer 120 can provide a layer of material that can be selectively removed relative to the underlying substrate material.

In various embodiments, the sacrificial exclusion layer 120 can be a semiconductor material that can be epitaxially grown on the substrate, including, but not limited to, silicon (Si), silicon-germanium (SiGe), III-V semiconductor materials (e.g., GaAs, etc.), and combinations thereof.

In various embodiments, the sacrificial exclusion layer 120 can have a thickness in a range of about 5 nanometers (nm) to about 50 nm, or about 10 nm to about 20 nm, although other thicknesses are also contemplated. The sacrificial exclusion layer 120 can be sufficiently thick to form accessible spacers between over and underlying layers.

In one or more embodiments, a fin layer 130 can be formed on the sacrificial exclusion layer 120, where the fin layer 130 can be formed by epitaxial growth on the surface of the sacrificial exclusion layer 120. The fin layer 130 can provide semiconductor material for forming vertical fins and semiconductor material below the fins that can be replaced to form a bottom source/drain. The fin layer 130 can have the same crystal structure and orientation as the substrate and sacrificial exclusion layer 120.

In various embodiments, the fin layer 130 can be a semiconductor material that can be epitaxially grown on the substrate, including, but not limited to, silicon (Si), silicon-germanium (SiGe), III-V semiconductor materials (e.g., GaAs, etc.), and combinations thereof.

In various embodiments, the fin layer 130 can have a thickness in a range of about 40 nanometers (nm) to about 150 nm, or about 60 nm to about 90 nm, although other thicknesses are also contemplated. The fin layer 130 can be sufficiently thick to provide vertical fins of a predetermined height.

In one or more embodiments, fin templates 150 can be formed on the substrate 110, where the fin templates 150 can be formed by lithographic techniques and etching. The fin templates 150 can be a hardmask material for forming vertical fins from the substrate, for example, titanium nitride (TiN), silicon oxide (SiO), silicon nitride (SiN), silicon oxynitride (SiON), silicon boro carbonitride (SiBCN), and combinations thereof.

In various embodiments, the fin templates 150 can be formed by a sidewall image transfer process, including, but not limited to, self-aligned double patterning (SADP), self-aligned triple patterning (SATP), and self-aligned quadruple patterning (SAQP). In various embodiments, fin templates 150 can be formed by masked and/or direct write lithographic processes, for example, extreme ultraviolet lithography (EUV), e-beam lithography, laser lithography, ion beam lithography, and combinations thereof.

Figure 2:
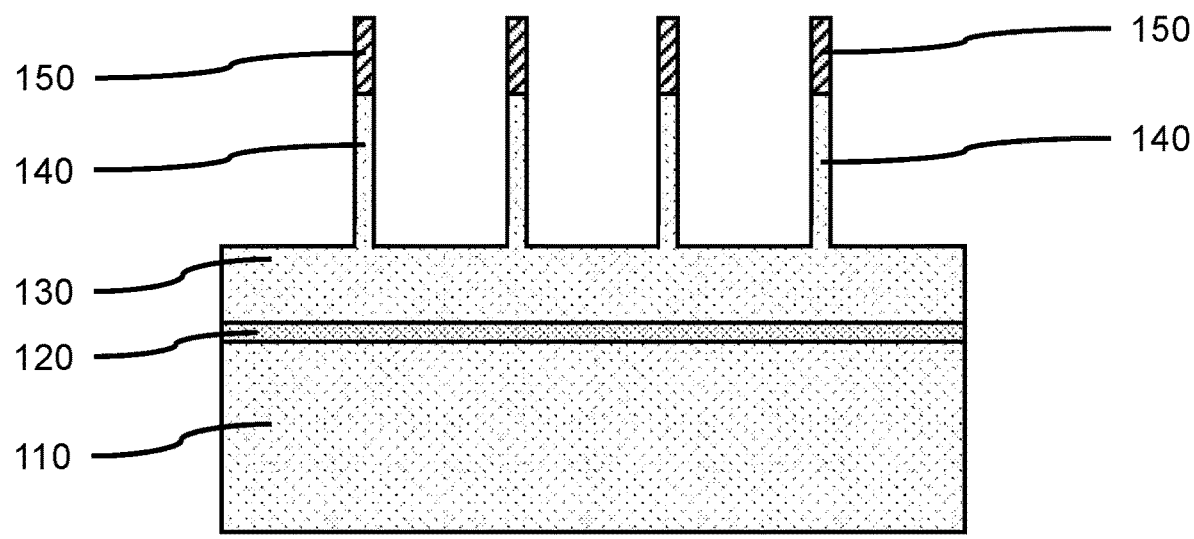
FIG. 2 is a cross-sectional side view showing a plurality of vertical fins formed below the fin templates from an upper portion of the fin layer, and the sacrificial exclusion layer remaining between the substrate and lower portion of the fin layer, in accordance with an embodiment of the present invention.

FIG. 2 is a cross-sectional side view showing a plurality of vertical fins formed below the fin templates from an upper portion of the fin layer, and the sacrificial exclusion layer remaining between the substrate and lower portion of the fin layer, in accordance with an embodiment of the present invention.

In one or more embodiments, a plurality of vertical fins 140 can be formed on a substrate 110, where the vertical fins can be formed by etching using fin templates 150. In various embodiments, the vertical fins 140 can be formed from the fin layer 130. A fin template 150 can remain on each of the vertical fins as part of the lithographic and etching processes.

In various embodiments, the vertical fins 140 can have a width in a range of about 4 nanometers (nm) to about 15 nm, or about 5 nm to about 10 nm, or about 6 nm to about 8 nm, although other widths are also contemplated.

In various embodiments, the vertical fins 140 can have a height in a range of about 20 nm to about 100 nm, or about 25 nm to about 80 nm, or about 30 nm to about 60 nm, although other heights are also contemplated.

In one or more embodiments, a thickness of the fin layer 130 can remain between the proximal surface of the sacrificial exclusion layer 120 and the base of the vertical fins 140, where the remaining thickness can be in a range of about 10 nm to about 100 nm, or about 20 nm to about 50 nm, although other thicknesses are also contemplated. The remaining thickness can be sufficient to form a bottom source/drain below the vertical fins.

Figure 3:
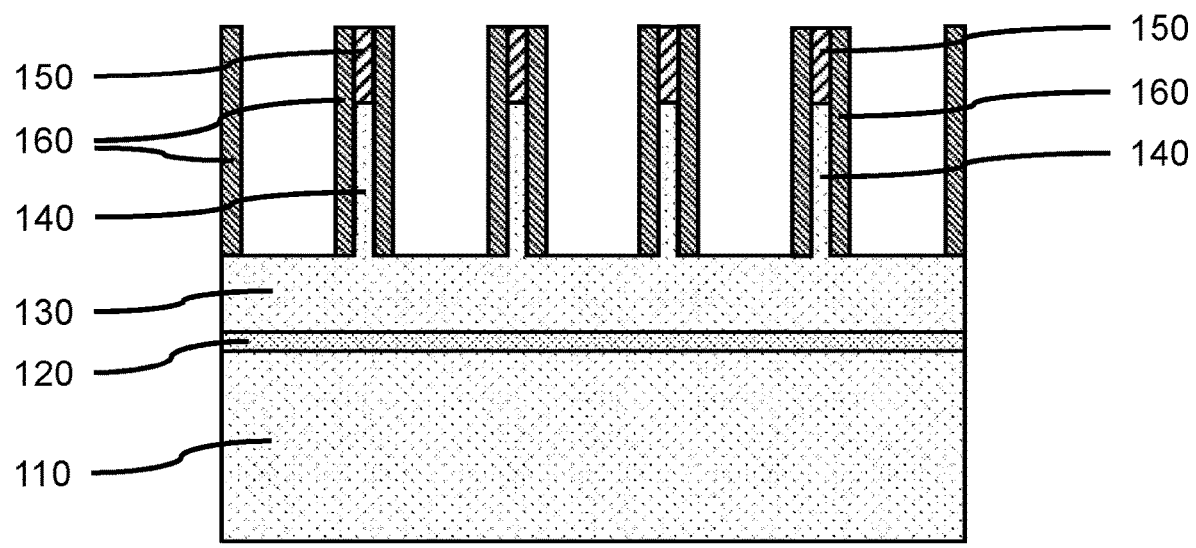
FIG. 3 is a cross-sectional side view showing sidewall spacers formed on the plurality of vertical fins from a sidewall spacer layer, in accordance with an embodiment of the present invention.

FIG. 3 is a cross-sectional side view showing sidewall spacers formed on the plurality of vertical fins from a sidewall spacer layer, in accordance with an embodiment of the present invention.

In one or more embodiments, sidewall spacers 160 can be formed on the plurality of vertical fins 140 and fin templates 150 from a sidewall spacer layer. The fin spacer layer can be formed on the vertical fins 140 and fin templates 150 by a conformal deposition, including, but not limited to, atomic layer deposition (ALD), plasma enhanced ALD (PEALD), and combinations thereof. Portions of the sidewall spacer layer can be removed using a selective, directional etch, for example, a reactive ion etch (RIE) to leave the sidewall spacers 160 on the vertical fins 140 and underlying fin layer 130.

In various embodiments, the sidewall spacer layer and sidewall spacers 160 can be made of a hardmask material, including, but not limited to, silicon oxide (SiO), silicon nitride (SiN), silicon oxynitride (SiON), silicon carbide (SiC), silicon carbonitride (SiCN), silicon boronitride (SiBN), silicon boro carbonitride (SiBCN), aluminum oxide (AlO), titanium oxide (TiO), and combinations thereof.

In various embodiments, the sidewall spacers 160 can have a width in a range of about 2 nm to about 20 nm, or about 3 nm to about 15 nm, or about 3 nm to about 8 nm, although other widths are also contemplated. The thickness of the sidewall spacer layer and width of the sidewall spacers 160 can provide an offset distance for self-aligned trenches and other layers. A space can remain between facing sidewall spacers 160 on adjacent vertical fins 140 with the surface of the remaining fin layer 130 exposed in the spacing.

Figure 4:
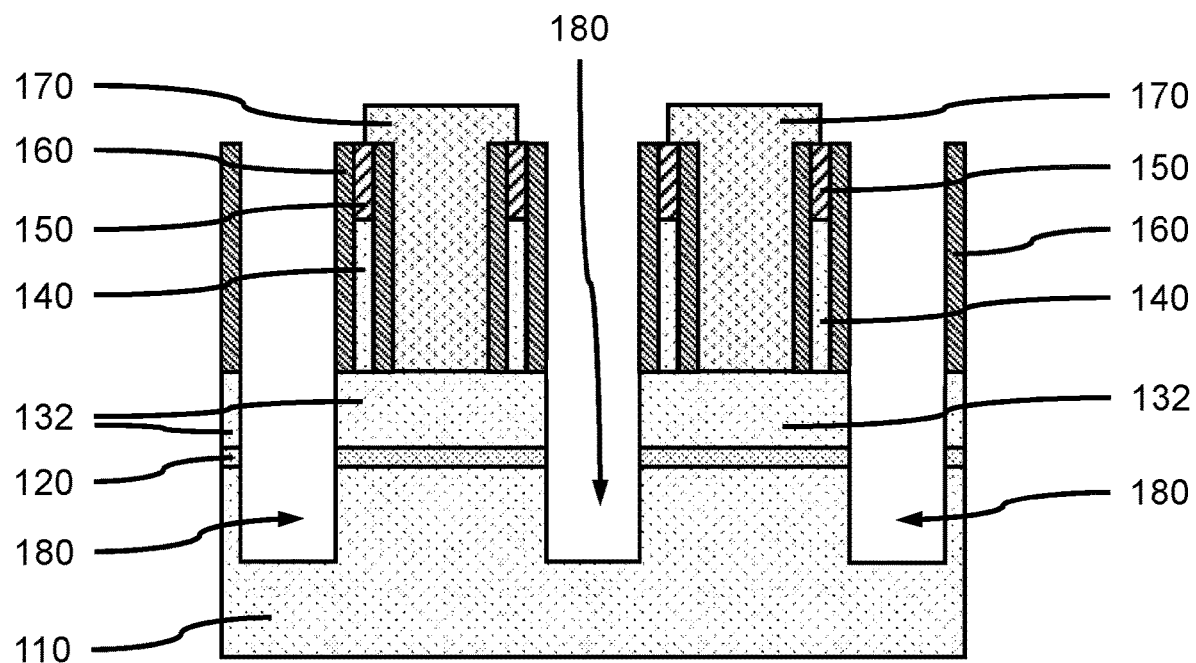
FIG. 4 is a cross-sectional side view showing masking plugs formed between predetermined adjacent vertical fins, and trenches formed in the substrate between adjacent vertical fins not covered by the masking plugs that fashion fin mesas, in accordance with an embodiment of the present invention.

FIG. 4 is a cross-sectional side view showing masking plugs formed between predetermined adjacent vertical fins, and trenches formed in the substrate between adjacent vertical fins not covered by the masking plugs that fashion fin mesas, in accordance with an embodiment of the present invention.

In one or more embodiments, a masking layer can be formed on the fin layer 130, sidewall spacers 160, and fin templates 150, where the masking layer can be formed by a blanket deposition, for example, chemical vapor deposition (CVD), plasma enhanced CVD (PECVD), physical vapor deposition (PVD), spin-on, or a combination thereof. The portions of the masking layer can be removed to form masking plugs 170 by patterning using lithographic techniques and etching. The masking plugs 170 can be formed on the sidewall spacers 160 between predetermined adjacent vertical fins 140, whereas the fin layer 130 can be exposed in spaces between vertical fins 140 not filled by masking plugs 170.

In one or more embodiments, trench(es) 180 can be formed through the fin layer 130, sacrificial exclusion layer 120, and into the substrate 110 between sidewall spacers 160, where the trench(es) 180 can be formed by one or more directional etches (e.g., RIE). The distance between the sidewall spacers 160 can determine the width of the trench(es) 180.

In various embodiments, etching of the trench(es) 180 can form fin mesas 132 beneath two or more vertical fins from the remaining portion of the fin layer 130. The fin mesa(s) 132 can be between the sacrificial exclusion layer 120 and overlying vertical fins 140.

Figure 5:
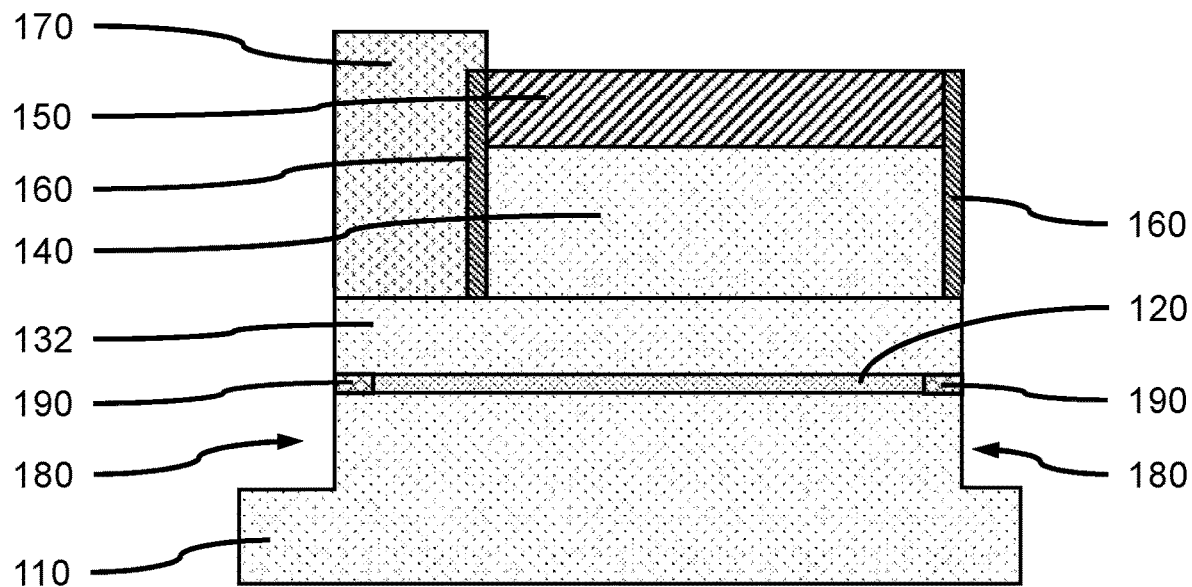
FIG. 5 is a cross-sectional side view perpendicular to FIG. 4 showing a long axis of a vertical fin with a masking plug on one end, trenches formed in the substrate adjacent to the masking plug and sidewall spacer, and temporary inner spacers formed in recesses in the sacrificial exclusion layer, in accordance with an embodiment of the present invention.

FIG. 5 is a cross-sectional side view perpendicular to FIG. 4 showing a long axis of a vertical fin with a masking plug on one end, trenches formed in the substrate adjacent to the masking plug and sidewall spacer, and temporary inner spacers formed in recesses in the sacrificial exclusion layer, in accordance with an embodiment of the present invention.

In one or more embodiments, formation of the trench(es) 180 expose sidewalls of the fin mesa(s) 132, edges of the sacrificial exclusion layer 120, and sidewalls of the substrate 110.

In one or more embodiments, portion of the sacrificial exclusion layer 120 can be removed using a selective isotropic etch or selective lateral etch, for example, a wet chemical etch, dry plasma etch, or combination thereof. Removal of the portion of the sacrificial exclusion layer 120 can form a recess between the fin mesas 132 and underlying substrate, where the recess wraps around the perimeter of the sacrificial exclusion layer 120. In various embodiments, the recess(es) can have a depth in a range of about 2 nm to about 20 nm, or about 3 nm to about 15 nm, or about 3 nm to about 8 nm, although other widths are also contemplated.

In one or more embodiments, a temporary inner spacer 190 can be formed in each of the recesses, where the temporary inner spacer 190 can be formed by a conformal deposition (e.g., ALD, PEALD) and an isotropic etch-back process. The temporary inner spacer 190 can fill in the recess and wrap around the sacrificial exclusion layer 120 between the fin mesas 132 and underlying substrate.

In various embodiments, the temporary inner spacer 190 can be a material that can be deposited by a conformal deposition and be selective etched relative to the other exposed materials that is compatible with the masking layer 170 (e.g., OPL), for example, titanium oxide (TiO), silicon oxide (SiO), silicon nitride (SiN), aluminum oxide (AlO), silicon carbide (SiC), silicon oxycarbide (SiOC), and combinations thereof.

Figure 6:
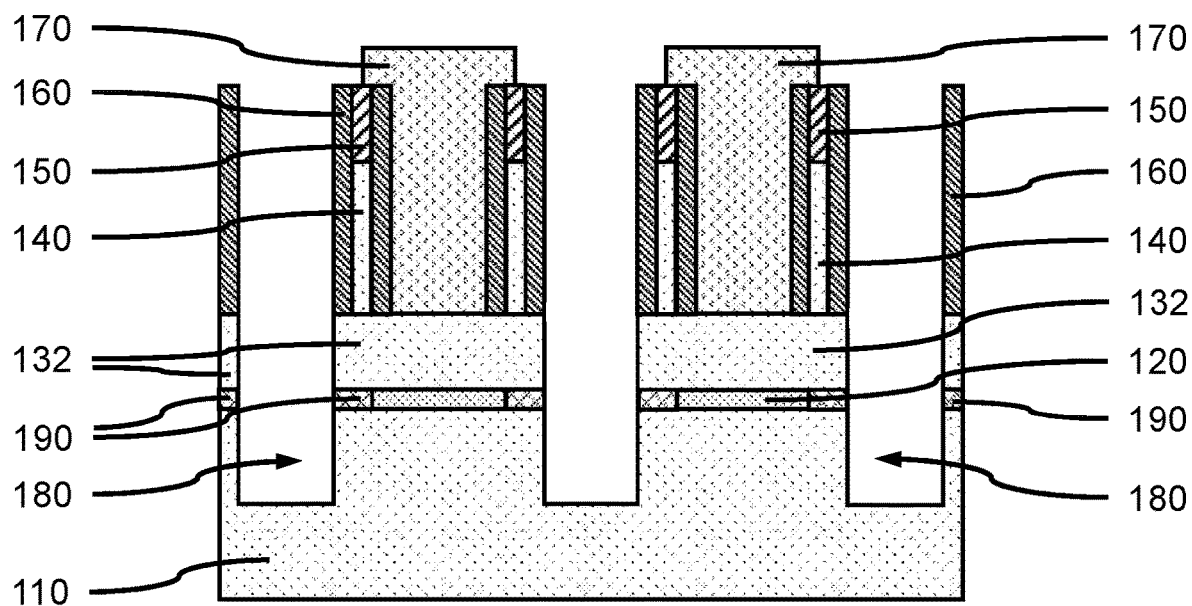
FIG. 6 is a cross-sectional side view showing temporary inner spacers formed in recesses along the edges between the fin mesas and underlying substrate, where the recess are formed by removing portions of the sacrificial exclusion layer, in accordance with an embodiment of the present invention.

FIG. 6 is a cross-sectional side view showing temporary inner spacers formed in recesses along the edges between the fin mesas and underlying substrate, where the recess are formed by removing portions of the sacrificial exclusion layer, in accordance with an embodiment of the present invention.

In one or more embodiments, the temporary inner spacers 190 are formed in the recesses along the edges of the sacrificial exclusion layer 120 between the fin mesas 132 and underlying substrate 110, so the sacrificial exclusion layer 120 can be physically isolated from the trenches 180.

Figure 7:
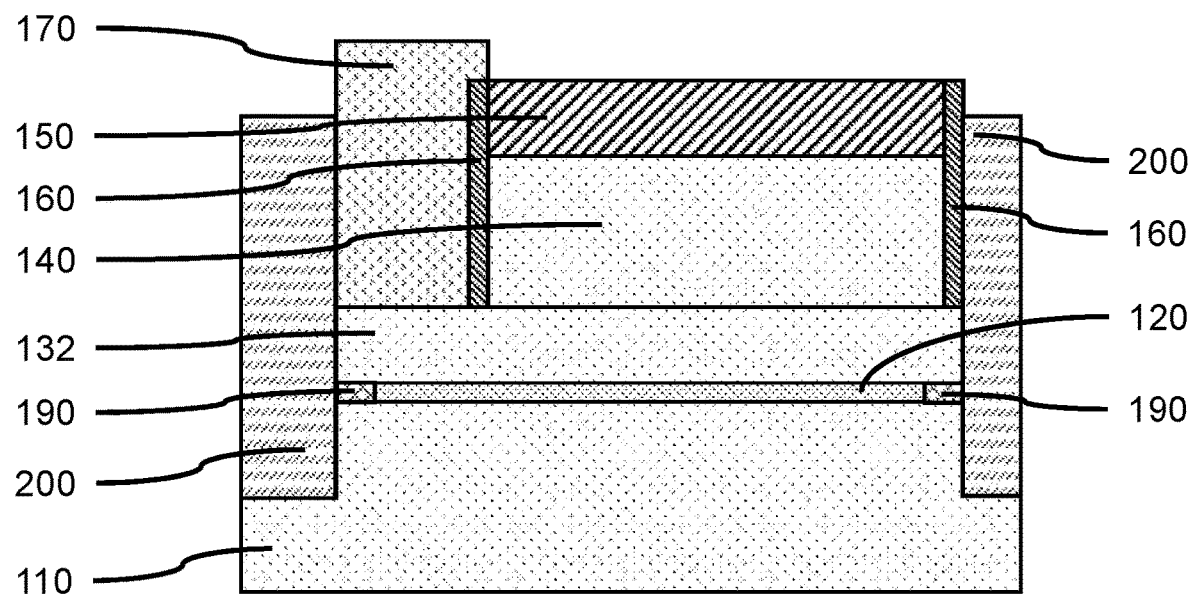
FIG. 7 is a cross-sectional side view perpendicular to FIG. 6 showing a fill layer formed in the trenches adjacent to the masking plug and sidewall spacer, in accordance with an embodiment of the present invention.

FIG. 7 is a cross-sectional side view perpendicular to FIG. 6 showing a fill layer formed in the trenches adjacent to the masking plug and sidewall spacer, in accordance with an embodiment of the present invention.

In one or more embodiments, a fill layer 200 can be formed in the trenches 180 adjacent to the masking plug(s) 170 and sidewall spacer(s) 160. The fill layer 200 can be formed by a blanket deposition (e.g., CVD, PECVD, spin-on) that covers the top surfaces of the fin template 150, sidewall spacer(s) 160, and masking plug(s) 170, and etched back to expose the fin template 150, sidewall spacer(s) 160, and masking plug(s) 170. The top surface of the fill layer 200 can be etched back to below the tops of the sidewall spacers 160.

In various embodiments, the fill layer 200 can be an organic planarization layer (OPL), spin-on coatings and resins, flowable oxides, or combination thereof.

Figure 8:
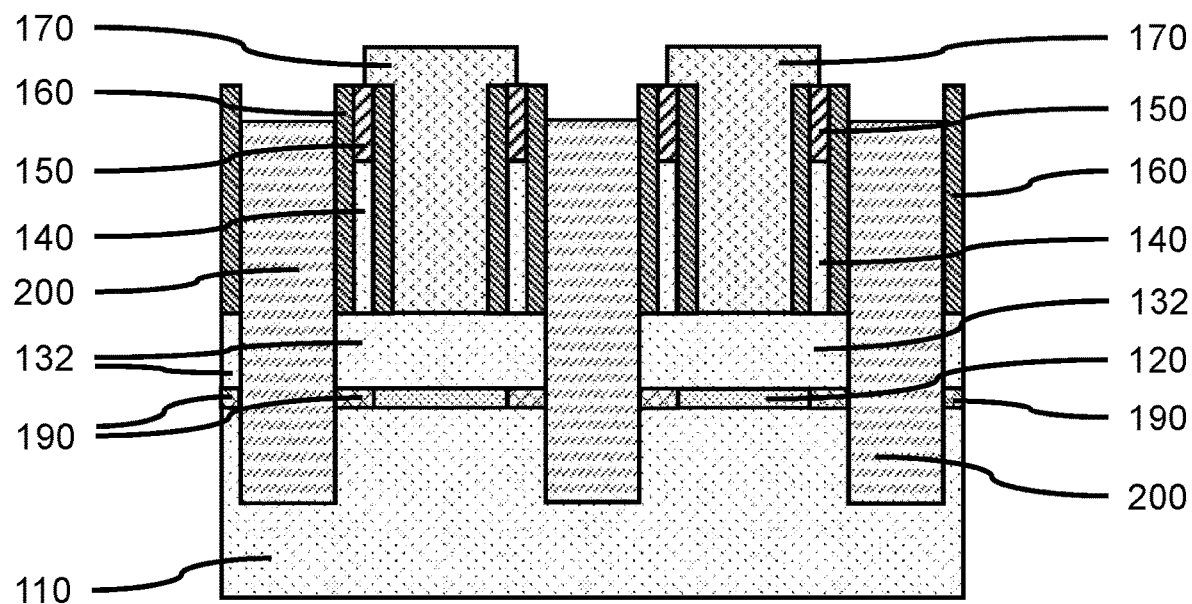
FIG. 8 is a cross-sectional side view showing the fill layer formed in the trenches between the fin mesas and sidewall spacers on adjacent vertical fins, in accordance with an embodiment of the present invention.

FIG. 8 is a cross-sectional side view showing the fill layer formed in the trenches between the fin mesas and sidewall spacers on adjacent vertical fins, in accordance with an embodiment of the present invention.

In one or more embodiments, the fill layer 200 can fill in the trenches 180 and space between sidewall spacers 160, and cover the sidewalls of the fin mesas 132 and temporary inner spacers 190.

Figure 9:
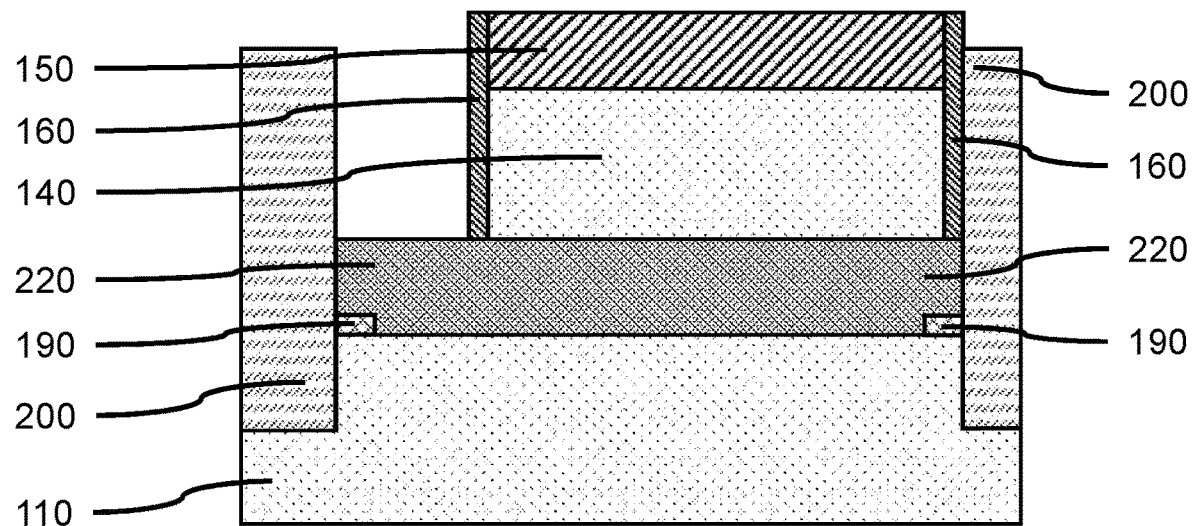
FIG. 9 is a cross-sectional side view perpendicular to FIG. 8 showing the masking plug removed from between the fill layer and sidewall spacer, and the fin mesa and remaining sacrificial exclusion layer replaced with a bottom source/drain, in accordance with an embodiment of the present invention.

FIG. 9 is a cross-sectional side view perpendicular to FIG. 8 showing the masking plug removed from between the fill layer and sidewall spacer, and the fin mesa and remaining sacrificial exclusion layer replaced with a bottom source/drain, in accordance with an embodiment of the present invention.

In one or more embodiments, the masking plug(s) 170 can be removed from between the fill layer 200 and sidewall spacer(s) 160, where the masking plug(s) 170 can be removed using a selective isotropic etch. Removal of the masking plug(s) 170 can expose at least a portion of the underlying fin mesa 132.

In one or more embodiments, the fin mesa(s) 132 can be removed from beneath the vertical fins 140, where the fin mesa(s) 132 can be removed by a selective lateral etch. Removal of the fin mesa 132 can expose the underlying portion of the sacrificial exclusion layer 120. The etch rate to under-cut the vertical fins and remove the fin mesa(s) 132 can be slow, but the bottom of the vertical fins can also be etched. To compensate for removal of a portion of the bottom of the vertical fins by etching an initial epitaxial growth of an undoped or a lightly doped material can be used to replace the material, followed by a more heavily doped epitaxial growth of a bottom source/drain. The temporary inner spacer 190 can remain on the substrate 110. In various embodiments, the remaining portion of the sacrificial exclusion layer 120 can also be removed. Removal of the sacrificial exclusion layer 120 and/or fin mesa 132 can form a void space between the base of the vertical fin(s) 140 and the substrate 110.

In one or more embodiments, a bottom source/drain 220 can be formed in the void space(s) created by removing the fin mesa(s) 132 and remaining portion of the sacrificial exclusion layer 120. The bottom source/drain 220 can be formed by epitaxial growth on the exposed substrate surface.

Figure 10:
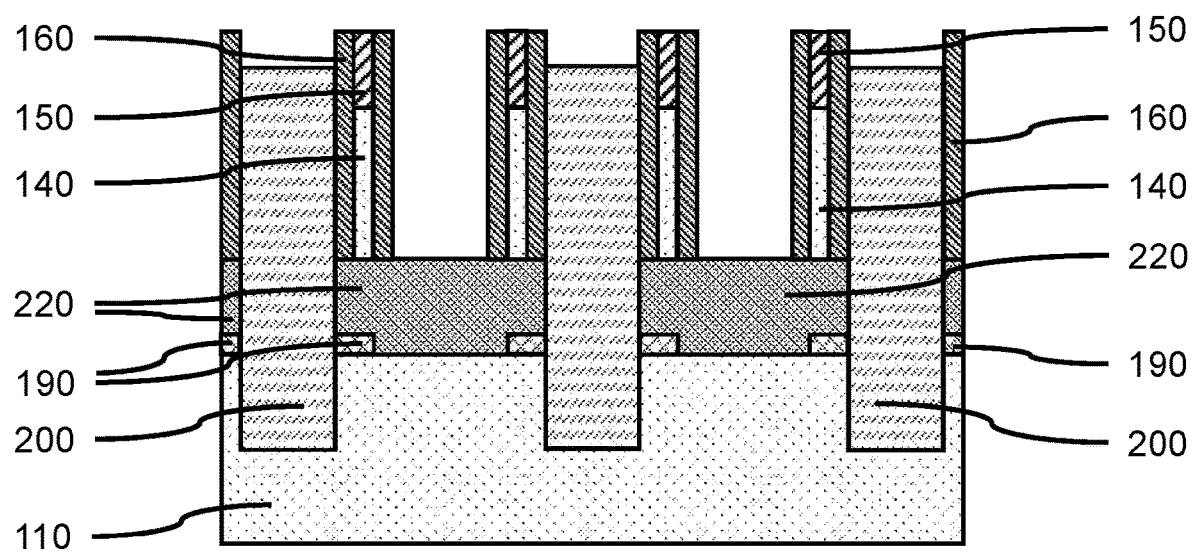
FIG. 10 is a cross-sectional side view showing the masking plug removed from between the sidewall spacers, and the fin mesa and remaining sacrificial exclusion layer replaced with a bottom source/drain, in accordance with an embodiment of the present invention.

FIG. 10 is a cross-sectional side view showing the masking plug removed from between the sidewall spacers, and the fin mesa and remaining sacrificial exclusion layer replaced with a bottom source/drain, in accordance with an embodiment of the present invention.

In one or more embodiments, the bottom source/drain(s) 220 can fill the void space extend between the fill layer 200 formed in the trenches 180. The bottom source/drain(s) 220 can be in electrical contact with the vertical fins 140.

Figure 11:
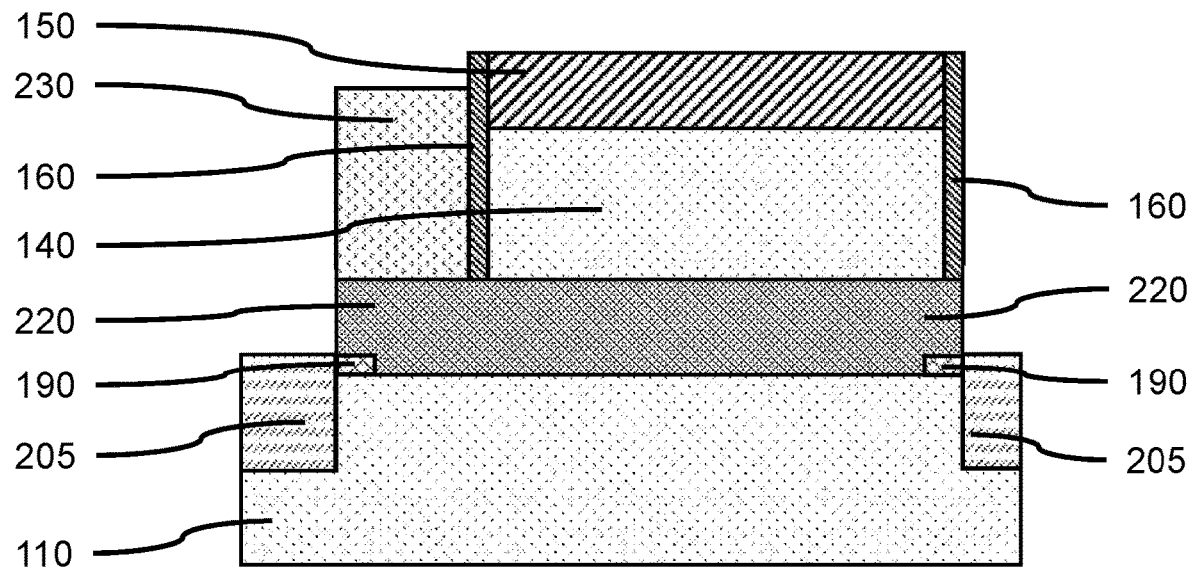
FIG. 11 is a cross-sectional side view perpendicular to FIG. 10 showing a blocking layer formed on the bottom source/drain, and an upper portion of the fill layer removed to form a fill slab adjacent to the temporary inner spacers, in accordance with an embodiment of the present invention.

FIG. 11 is a cross-sectional side view perpendicular to FIG. 10 showing a blocking layer formed on the bottom source/drain, and an upper portion of the fill layer removed to form a fill slab adjacent to the temporary inner spacers, in accordance with an embodiment of the present invention.

In one or more embodiments, a blocking layer 230 can be formed on the bottom source/drain(s) 220. In various embodiments, the blocking layer 230 can be an organic planarization layer (OPL), spin-on coatings and resins, flowable oxides, or combination thereof.

In one or more embodiments, an upper portion of the fill layer 200 can be removed to form a fill slab 205 at the bottom of the trench(es) 180 and adjacent to the temporary inner spacers 190, where the top surface of the fill slab 205 can be above the top of the temporary inner spacers 190. The upper portion of the fill layer 200 can be removed using a selective isotropic etch. Removal of the upper portion of the fill layer can expose the sidewalls of the bottom source/drain 220.

Figure 12:
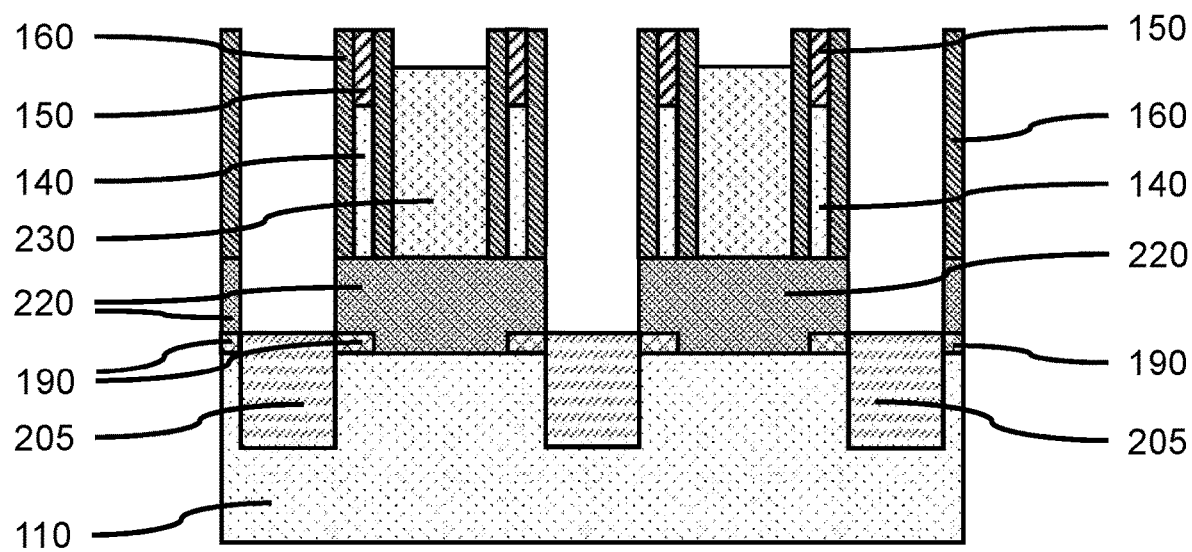
FIG. 12 is a cross-sectional side view showing the blocking layer formed on the bottom source/drain between sidewall spacers, and an upper portion of the fill layer removed to form a fill slab adjacent to the temporary inner spacers, in accordance with an embodiment of the present invention.

FIG. 12 is a cross-sectional side view showing the blocking layer formed on the bottom source/drain between sidewall spacers, and an upper portion of the fill layer removed to form a fill slab adjacent to the temporary inner spacers, in accordance with an embodiment of the present invention.

In one or more embodiments, the removal of the upper portion of the fill layer 200 can reopen the trench(es) 180 down to the bottom source/drain 220.

Figure 13:
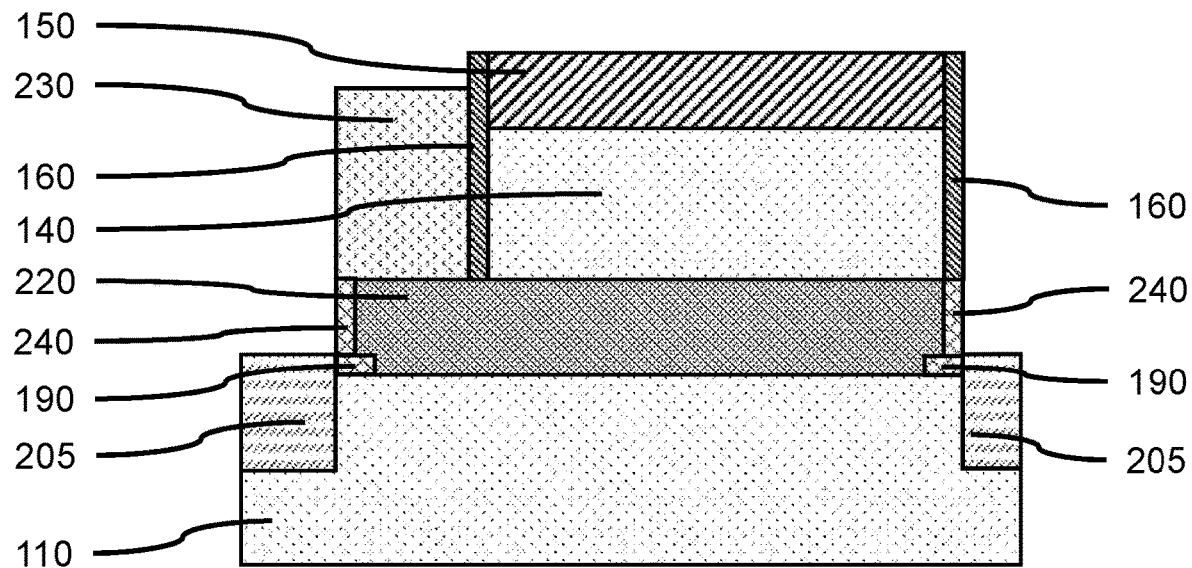
FIG. 13 is a cross-sectional side view perpendicular to FIG. 12 showing a side portion of the bottom source/drains removed to form gaps above the temporary inner spacers, and temporary gap fillers formed in the gaps, in accordance with an embodiment of the present invention.

FIG. 13 is a cross-sectional side view perpendicular to FIG. 12 showing a side portion of the bottom source/drains removed to form gaps above the temporary inner spacers, and temporary gap fillers formed in the gaps, in accordance with an embodiment of the present invention.

In one or more embodiments, a side portion of the bottom source/drains 220 above the temporary inner spacers 190 can be removed to form gaps above the temporary inner spacers 190, where the side portion of the bottom source/drains 220 can be removed using a selective lateral etch. The gaps can extend inwards below the sidewall spacer(s) 160 and blocking layer 230, but would not undercut the vertical fins 140.

In one or more embodiments, temporary gap fillers 240 can be formed in the gaps below the sidewall spacer(s) 160 and blocking layer 230. The temporary gap fillers 240 can be formed by a conformal deposition (e.g., ALD, PEALD), and directional etch (e.g., RIE).

In various embodiments, the temporary gap fillers 240 can be a material that can be selectively etched relative to the surrounding exposed materials, for example, titanium oxide (TiO), titanium nitride (TiN), silicon oxide (SiO), silicon nitride (SiN), aluminum oxide (AlO), silicon carbide (SiC), silicon oxycarbide (SiOC), and combinations thereof. The temporary gap filler 240 and temporary inner spacer 190 can be the same material, so both can be removed together by a selective etch.

Figure 14:
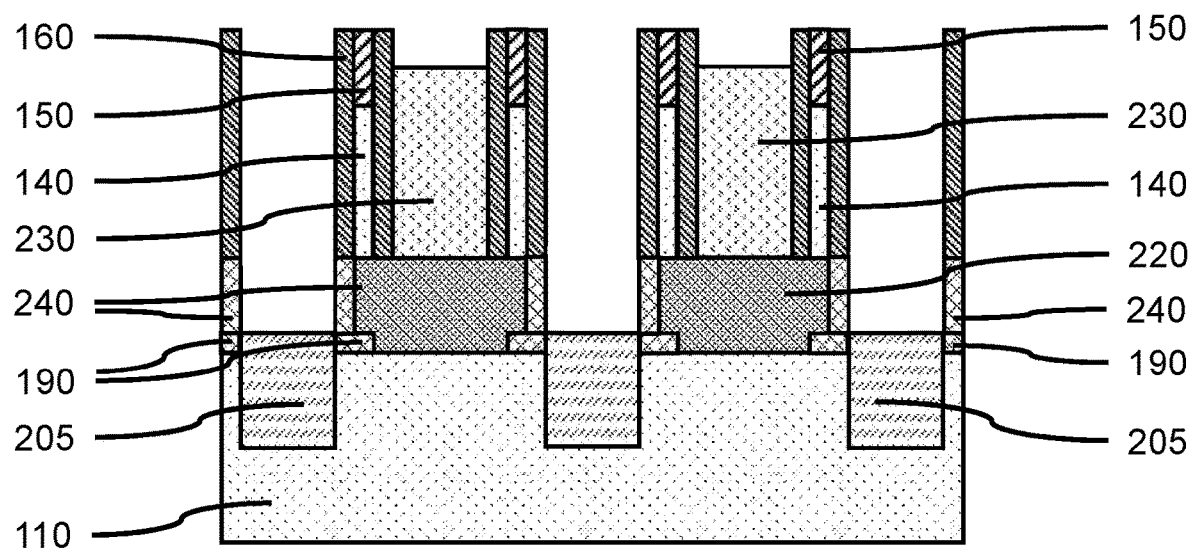
FIG. 14 is a cross-sectional side view showing the side portion of the bottom source/drains removed to form gaps above the temporary inner spacers, and the temporary gap fillers formed in the gaps, in accordance with an embodiment of the present invention.

FIG. 14 is a cross-sectional side view showing the side portion of the bottom source/drains removed to form gaps above the temporary inner spacers, and the temporary gap fillers formed in the gaps, in accordance with an embodiment of the present invention.

In various embodiments, the temporary gap fillers 240 do not extend below the vertical fins 140, so the vertical fins remain on and in physical contact with the bottom source/drains 220.

Figure 15:
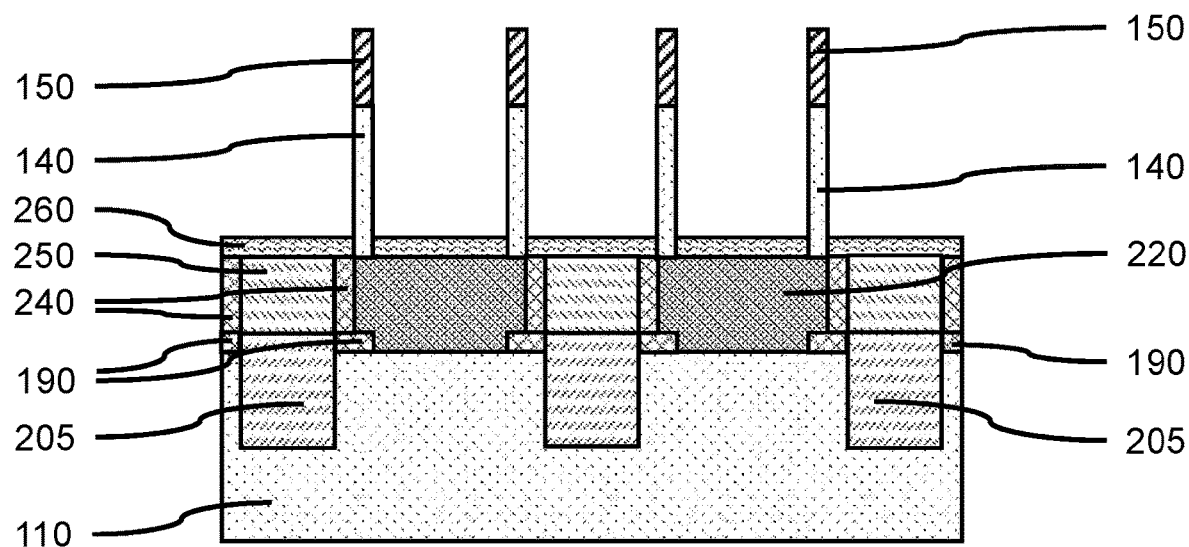
FIG. 15 is a cross-sectional side view showing isolation regions formed on the fill slabs adjacent to the temporary gap fillers, and a bottom spacer layer formed on the isolation regions and bottom source/drains after removing the blocking layer, in accordance with an embodiment of the present invention.

FIG. 15 is a cross-sectional side view perpendicular to FIG. 14 showing isolation regions formed on the fill slabs adjacent to the temporary gap fillers, and a bottom spacer layer formed on the isolation regions and bottom source/drain after removing the blocking layer, in accordance with an embodiment of the present invention.

In one or more embodiments, isolation regions 250 can be formed on the fill slabs 205 adjacent to the temporary gap fillers 240. The isolation regions 250 can cover the sidewalls of the temporary gap fillers 240.

In various embodiments, the isolation regions 250 can be made of an electrically insulating, dielectric material, including, but not limited to, silicon oxide (SiO), silicon nitride (SiN), silicon oxynitride (SiON), silicon carbide (SiC), silicon carbonitride (SiCN), silicon boronitride (SiBN), silicon boro carbonitride (SiBCN), aluminum oxide (AlO), low-k dielectric materials, and combinations thereof. The low-k dielectric materials can be carbon-doped silicon oxide (SiO:C), fluorine doped silicon oxide (SiO:F), carbon-based polymeric materials (OPL), silicon based polymeric dielectric materials, for example, hydrogen silsesquioxane (HSQ) and methylsilsesquioxane (MSQ), tetraethoxysilane (TEOS), and combinations thereof. In various embodiments, the isolation regions 250 can be the same material as the fill slabs 205.

In one or more embodiments, the sidewall spacers 160 and blocking layer 230 can be removed using a selective isotropic etch to expose the underlying temporary gap fillers 240 and bottom source/drains 220.

In one or more embodiments, a bottom spacer layer 260 can be formed on the isolation regions 250, temporary gap fillers 240, and bottom source/drains 220, where the bottom spacer layer 200 can be formed by a directional deposition, for example, a gas cluster ion beam (GCIB) deposition, high density plasma (HDP) deposition, directional sputter deposition, or a combination thereof. An isotropic etch-back can be used to remove deposited material from the sidewalls of the vertical fins 112. The directional deposition can fill in the hollow space below the surface of the diffusion barrier layer 190. In one or more embodiments, the bottom spacer layer 260 can extend between the sidewalls of the vertical fins 140 and cover the bottom source/drains 220.

In one or more embodiments, the bottom spacer layer 260 can be an electrically insulating dielectric material, including, but not limited to, silicon oxide (SiO), silicon nitride (SiN), silicon oxynitride (SiON), a low-k dielectric, or a combination thereof. The low-k dielectric materials can be carbon-doped silicon oxide (SiO:C), fluorine doped silicon oxide (SiO:F), carbon-based polymeric materials (OPL), silicon based polymeric dielectric materials, for example, hydrogen silsesquioxane (HSQ) and methylsilsesquioxane (MSQ), tetraethoxysilane (TEOS), and combinations thereof.

Figure 16:
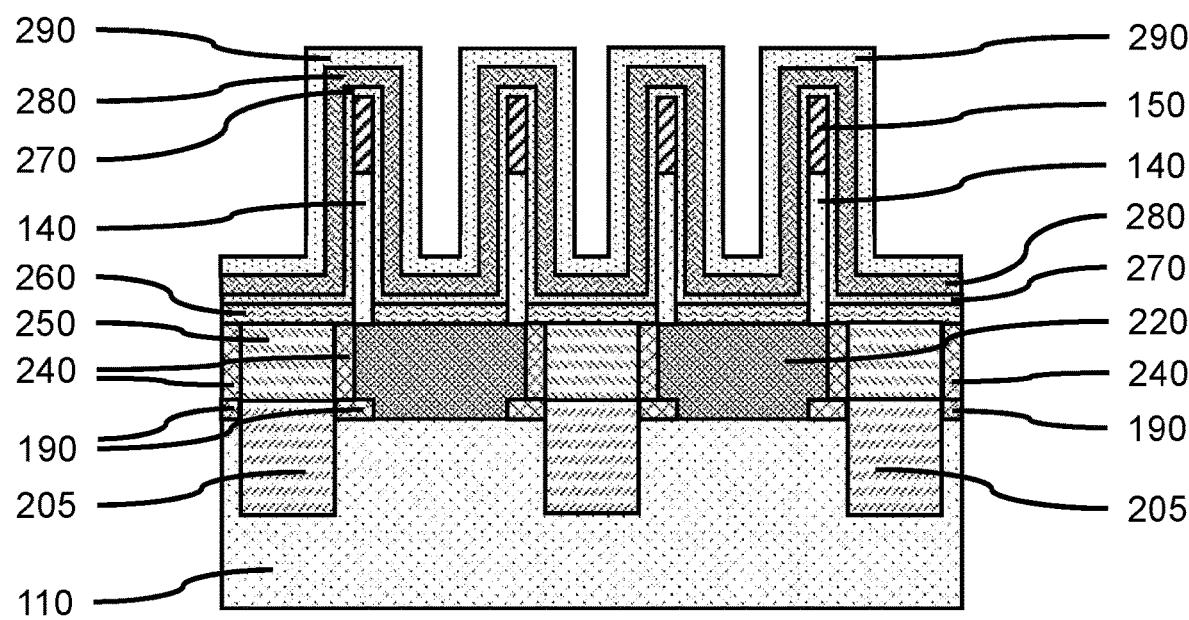
FIG. 16 is a cross-sectional side view showing a gate dielectric layer formed on the vertical fins and bottom spacer layer, a sacrificial liner layer formed on the gate dielectric layer, and a sacrificial cover layer formed on the sacrificial liner layer, in accordance with an embodiment of the present invention.

FIG. 16 is a cross-sectional side view showing a gate dielectric layer formed on the vertical fins and bottom spacer layer, a sacrificial liner layer formed on the gate dielectric layer, and a sacrificial cover layer formed on the sacrificial liner layer, in accordance with an embodiment of the present invention.

In one or more embodiments, a gate dielectric layer 270 can be formed on the exposed surfaces of the vertical fins 140, fin templates 150, and bottom spacer layer 260, where the gate dielectric layer 270 can be formed by a conformal deposition (e.g., ALD, PEALD).

In various embodiments, the gate dielectric layer 270 can be a dielectric material, including, but not limited to, silicon oxide (SiO), silicon nitride (SiN), silicon oxynitride (SiON), silicon boronitride (SiBN), silicon boro carbonitride (SiBCN), silicon carbonitride (SiCN), silicon oxycarbonitride (SiOCN), a high-k dielectric, and combinations thereof. Examples of high-k materials include, but are not limited to, metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 270 can have a thickness in a range of about 1 nm to about 3 nm, or about 2 nm, although other thicknesses are also contemplated.

In one or more embodiments, a sacrificial liner layer 280 can be formed on the gate dielectric layer, where the sacrificial liner layer 280 can be formed by a conformal deposition.

In various embodiments, the sacrificial liner layer 280 can be a sacrificial metal compound material, including, but not limited to, titanium nitride (TiN), titanium carbide (TiC), etc., that can be selectively removed.

In various embodiments, the sacrificial liner layer 280 can have a thickness in a range of about 0.5 nm to about 3 nm, or about 1 nm to about 2 nm, although other thicknesses are also contemplated.

In one or more embodiments, a sacrificial cover layer 290 formed on the sacrificial liner layer 280, where the sacrificial cover layer 290 can be formed by a conformal deposition.

In various embodiments, the sacrificial cover layer 290 can be an oxygen barrier material that prevents excessive amounts of oxygen passing to the gate dielectric layer, including, but not limited to, amorphous silicon (a-Si), amorphous carbon (a-C), amorphous silicon-germanium (a-SiGe), etc.

In various embodiments, the sacrificial cover layer 290 can have a thickness in a range of about 2 nm to about 15 nm, or about 3 nm to about 8 nm, although other thicknesses are also contemplated. In various embodiments, a reliability anneal can be performed to densify the high-k gate dielectric thus improving the quality of gate dielectric.

Figure 17:
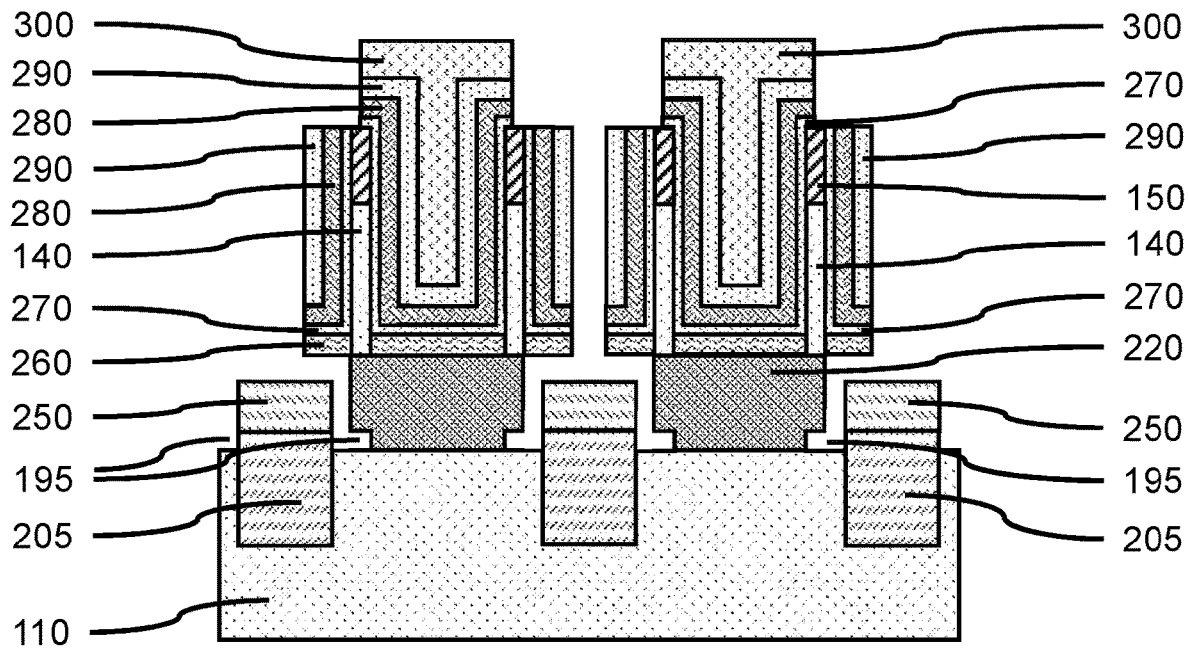
FIG. 17 is a cross-sectional side view showing shield plugs formed on the sacrificial cover layer between adjacent vertical fins, portions of the sacrificial cover layer and sacrificial liner layer removed, and the temporary gap fillers and temporary inner spacers removed to form contact channels, in accordance with an embodiment of the present invention.

FIG. 17 is a cross-sectional side view showing shield plugs formed on the sacrificial cover layer between adjacent vertical fins, portions of the sacrificial cover layer and sacrificial liner layer removed, and the temporary gap fillers and temporary inner spacers removed to form contact channels, in accordance with an embodiment of the present invention.

In one or more embodiments, shield plugs 300 can be formed on the sacrificial cover layer 290 in the space between adjacent vertical fins 140. The shield plugs 300 can be formed by a blanket deposition and etch using lithographic techniques for patterning, where the shield plugs 300 can cover a portion of the sacrificial cover layer 290 and sacrificial liner layer 280 on one of the sidewalls of the vertical fins 140.

In various embodiments, the shield plugs 300 can be an organic planarization layer (OPL), spin-on coatings and resins, flowable oxides, or combination thereof.

In one or more embodiments, exposed portions of the sacrificial cover layer 290, sacrificial liner layer 280, gate dielectric layer 270, and bottom spacer layer 260, can be removed using selective, directional etches (e.g., RIE). Vertical portions of the sacrificial cover layer 290 and sacrificial liner layer 280 can remain on the sidewalls of the vertical fins. Removal of the exposed portions of the sacrificial cover layer 290, sacrificial liner layer 280, gate dielectric layer 270, and bottom spacer layer 260 can form an aperture between adjacent sacrificial cover layers 290 that can expose isolation regions 250.

In one or more embodiments, the temporary gap fillers 240 and temporary inner spacers 190 can be removed to form contact channels 195 using an isotropic etch. The contact channels 195 can wrap around the bottom source/drains 220 and expose the sidewalls of the bottom source/drains.

Figure 18:
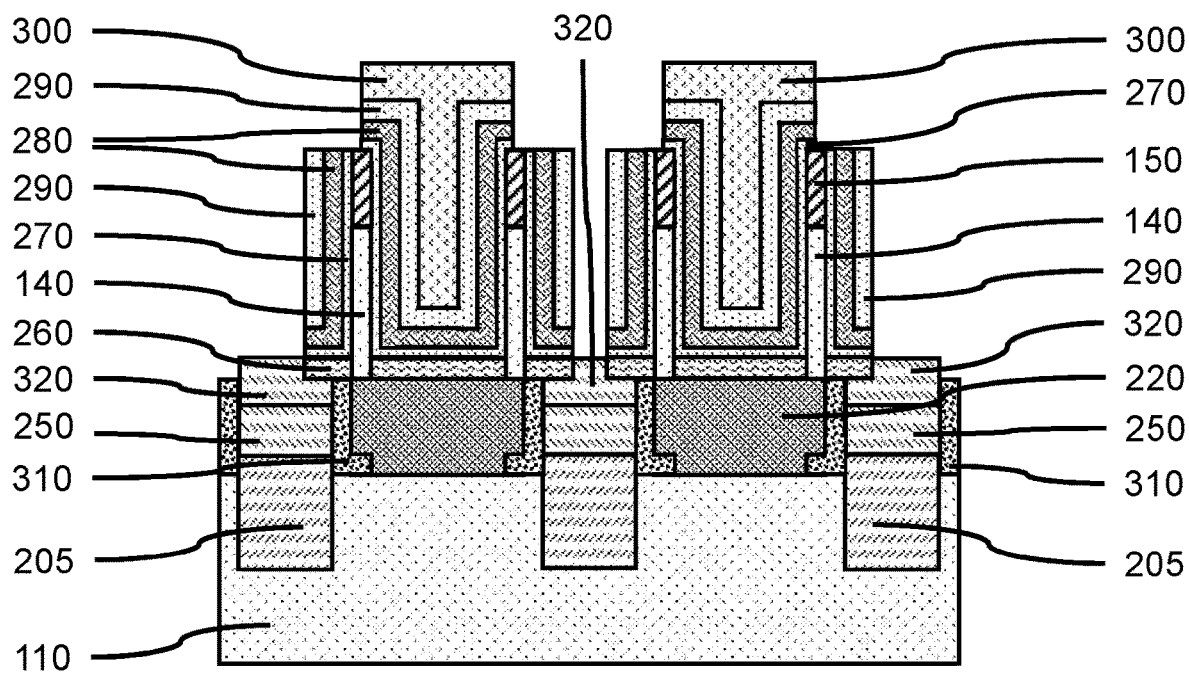
FIG. 18 is a cross-sectional side view showing a wrap-around contact formed in the contact channels, and a separation plate formed on the isolation region and wrap-around contact, in accordance with an embodiment of the present invention.

FIG. 18 is a cross-sectional side view showing a wrap-around contact formed in the contact channels, and a separation plate formed on the isolation region and wrap-around contact, in accordance with an embodiment of the present invention.

In one or more embodiments, a wrap-around source/drain contact 310 can be formed in the contact channel 195, where the wrap-around contact 310 can be formed by a conformal deposition (e.g., ALD, PEALD), and an isotropic etch back. The wrap-around source/drain contact 310 can be on four sides of the bottom source/drain 220 and below an outer edge portion of the bottom source/drain 220, where the wrap-around contact 310 can provide an increase in conductive surface area and a reduction in electrical resistance. A cross-section of the wrap-around source/drain contact 310 can be L-shaped. The wrap-around source/drain contact 310 can be formed after a high-k material reliability anneal on the gate dielectric layer before forming the wrap-around source/drain contact 310 to avoid the silicide degradation if the wrap-around-contact 310 is formed before high-k reliability anneal. A metal silicide between the wrap-around source/drain contact and the bottom source/drain is not degraded compared to a silicide at the interface that has undergone a reliability anneal.

In various embodiments, the wrap-around source/drain contact 310 can be made of a conductive metal, including, but not limited to, tungsten (W), aluminum (Al), copper (Cu), cobalt (Co), nickel (Ni), titanium (Ti), ruthenium (Ru), molybdenum (Mo), or a combination thereof.

In one or more embodiments, a separation plate 320 can be formed on the isolation region and wrap-around source/drain contact 310, where the separation plate 320 can be formed by a dielectric deposition and etch-back.

In various embodiments, the separation plate 320 can be made of an electrically insulating, dielectric material, including, but not limited to, silicon oxide (SiO), silicon nitride (SiN), silicon oxynitride (SiON), silicon carbide (SiC), silicon carbonitride (SiCN), silicon boronitride (SiBN), silicon boro carbonitride (SiBCN), aluminum oxide (AlO), low-k dielectric materials, and combinations thereof. In various embodiments, the separation plate 320 can be the same material as the isolation regions 250 and/or fill slabs 205.

Figure 19:
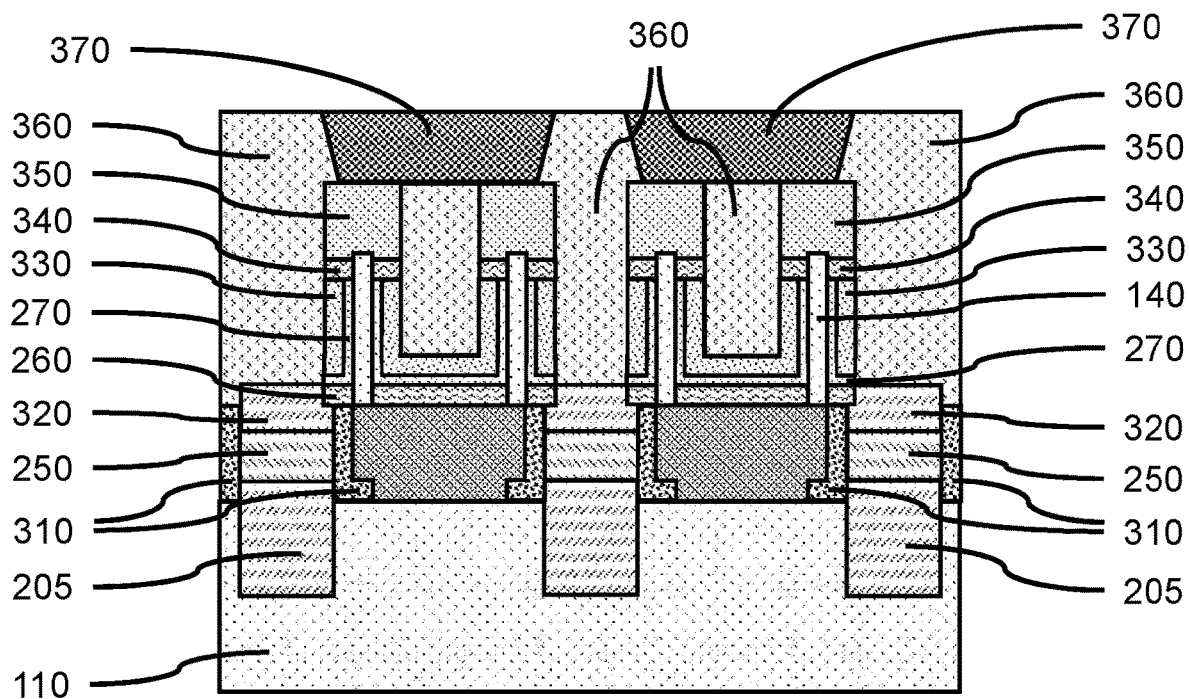
FIG. 19 is a cross-sectional side view showing the shield plugs, sacrificial cover layer, sacrificial liner layer replaced with a gate structure, top source/drains, interlayer dielectric, and source/drain contacts, in accordance with an embodiment of the present invention.

FIG. 19 is a cross-sectional side view showing the shield plugs, sacrificial cover layer, sacrificial liner layer replaced with a gate structure, top source/drains, interlayer dielectric, and source/drain contacts, in accordance with an embodiment of the present invention.

In one or more embodiments, the shield plugs 300, sacrificial cover layer 290, and sacrificial liner layer 280 can be removed using selective, isotropic etches to expose the gate dielectric layer.

In one or more embodiments, a conductive gate layer 330 can be formed on the gate dielectric layer 270, where the conductive gate layer 330 can be formed by a conformal deposition. The conductive gate layer 330 and gate dielectric layer 210 can form a gate structure on the vertical fin(s) 140 forming a VT FinFET.

In various embodiments, the conductive gate layer 330 can be a conducting material, including, but not limited to, doped polycrystalline or amorphous silicon (p-Si, a-Si), germanium (p-Ge, a-Ge), silicon germanium (p-SiGe, a-SiGe), a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotubes, conductive carbon, graphene, or any suitable combination of these materials.

In one or more embodiments, an interlayer dielectric (ILD) layer 360 can be formed by a blanket deposition on the substrate 110, bottom source/drains 220, vertical fins 140 and fin templates 150. In various embodiments, the interlayer dielectric (ILD) layer 360 can be an electrically insulating dielectric material, including, but not limited to, silicon oxide (SiO), silicon nitride (SiN), silicon oxynitride (SiON), a low-k dielectric, or a combination thereof.

In various embodiments, the fin templates 150 can be removed using selective etching to expose the underlying top surfaces of the vertical fins 140. In various embodiments, exposed portions of the conductive gate layer 330 and gate dielectric layer 270 can be removed using selective etching.

In one or more embodiments, a top spacer layer 340 can be formed on the remaining portions of the conductive gate layer 330 and gate dielectric layer 270, where the top spacer layer 340 can be formed by a dielectric deposition and etch-back. The top spacer layer 340 can cover a portion of the sidewalls of the vertical fin(s) 140.

In one or more embodiments, the top spacer layer 340 can be an electrically insulating dielectric material, including, but not limited to, silicon oxide (SiO), silicon nitride (SiN), silicon oxynitride (SiON), a low-k dielectric, or a combination thereof.

In one or more embodiments, top source/drains 350 can be formed on the exposed upper surfaces of the vertical fins 140, where the top source/drains 350 can be formed by an epitaxtal growth process. The top source/drains 350 can incorporate the same dopant as the bottom source/drain 220 underlying the same vertical fin 140. In various embodiments, different n-type or p-type dopants can be incorporated into the top source/drains 350 and bottom source/drains 220 of different vertical fins 140 to form a complementary metal-oxide-semiconductor (CMOS) device on the substrate 110. In various embodiments, multiple vertical fins can be electrically coupled to form a single VT FinFET device.

In one or more embodiments, a top source/drain contact 370 can be formed in the ILD layer 360, where the source/drain contact 370 can be formed using lithographic processes, etching, deposition(s), and planarization methods, for example, chemical-mechanical polishing (CMP). In various embodiments, the source/drain contact 370 can span two or more top source/drains 350 to form a CMOS device or electrically coupled fin channels of a VT FinFET.

In various embodiments, the top source/drain contact 370 can be made of a conductive material, including, but not limited to, tungsten (W), aluminum (Al), copper (Cu), cobalt (Co), nickel (Ni), titanium (Ti), ruthenium (Ru), molybdenum (Mo), or any other suitable conductive material, and combinations thereof. The metal top source/drain contact can further include a barrier layer. The barrier layer can be titanium nitride (TiN), tantalum nitride (TaN), hafnium nitride (HfN), niobium nitride (NbN), tungsten nitride (WN), tungsten carbon nitride (WCN), or combinations thereof, where the barrier layer can prevent diffusion and/or alloying of a metal contact material with the top source drain material, and/or other ILD layer material.

Figure 20:
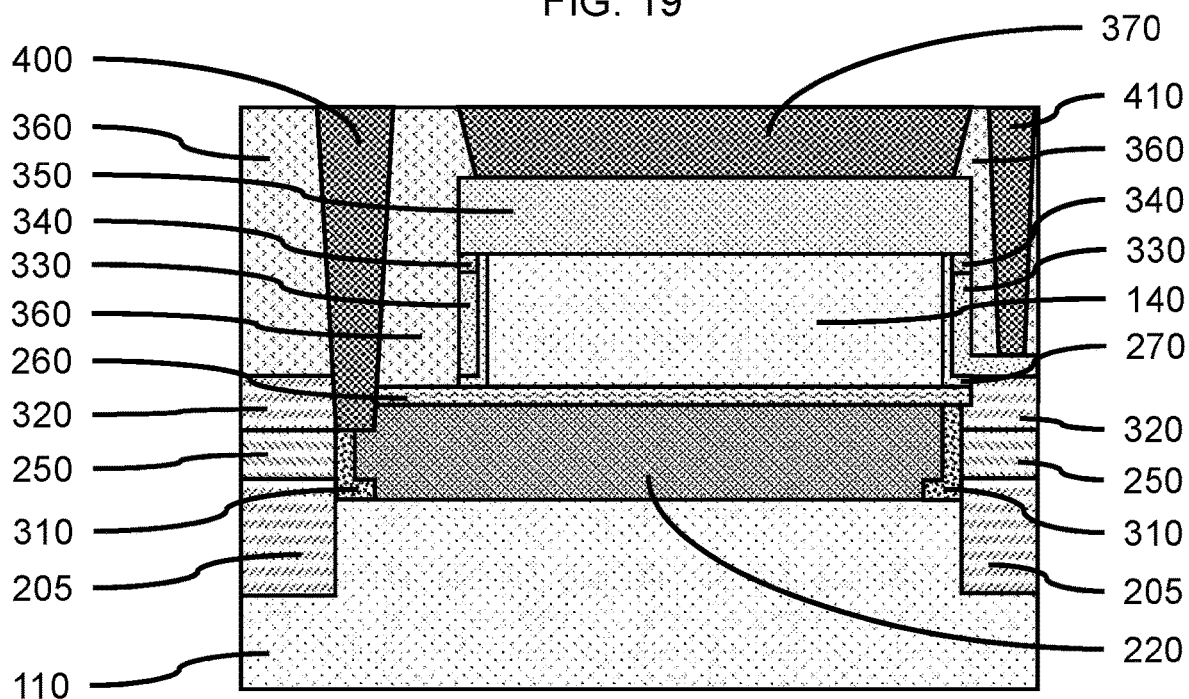
FIG. 20 is a cross-sectional side view perpendicular to FIG. 19 showing a bottom source/drain contact on the bottom source/drain and wrap-around contact, a conductive gate contact on a conductive gate layer, and a top source/drain contact on the top source/drain, in accordance with an embodiment of the present invention.

FIG. 20 is a cross-sectional side view perpendicular to FIG. 19 showing a bottom source/drain contact on the bottom source/drain and wrap-around contact, a conductive gate contact on a conductive gate layer, and a top source/drain contact on the top source/drain, in accordance with an embodiment of the present invention.

In one or more embodiments, an opening can be formed in the ILD layer 360 extending down to the wrap-around source/drain contact 310 and bottom source/drain 220, where the opening can be formed by lithographic processes and directional etching. The opening can be filled with a conductive material to form the bottom source/drain contact 400 in electrical contact with the wrap-around contact 310 and bottom source/drain 220. Formation of an L-shaped wrap-around-contact can improve the performance by increasing the electric contact surface area and also reducing the spreading resistance when flowing the current from the bottom source/drain contact 400 to the bottom source/drain 220.

In various embodiments, the bottom source/drain contact 400 can be made of a conductive material, including, but not limited to, tungsten (W), aluminum (Al), copper (Cu), cobalt (Co), nickel (Ni), titanium (Ti), ruthenium (Ru), molybdenum (Mo), or any other suitable conductive material, and combinations thereof. The metal contact can further include a barrier layer. The barrier layer can be titanium nitride (TiN), tantalum nitride (TaN), hafnium nitride (HfN), niobium nitride (NbN), tungsten nitride (WN), tungsten carbon nitride (WCN), or combinations thereof, where the barrier layer can prevent diffusion and/or alloying of a metal contact material with the top source drain material, and/or other ILD layer material.

In one or more embodiments, another opening can be formed in the ILD layer 360 extending down to the conductive gate layer 330, where the opening can be formed by lithographic processes and directional etching. The opening can be filled with a conductive material to form the conductive gate contact 410 in electrical contact with the conductive gate layer 330. In various embodiments, the conductive gate contact 410 is not over the bottom source/drain 220, where the conductive gate contact 410 can be on an opposite side of the vertical fin 140 from the bottom source/drain contact 400.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers steps, operations, elements and/or components, but do not preclude the presence or addition of one or more other features, integers, steps, operations, elements, components and/or groups thereof.

Spatially relative terms, such as "beneath," "below," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical transport fin field effect transistor device, comprising:
    replacing a portion of a sacrificial exclusion layer between one or more vertical fins and a substrate with a temporary inner spacer;
    removing a portion of a fin layer and the sacrificial exclusion layer between the one or more vertical fins and the substrate;
    forming a bottom source/drain on the temporary inner spacer and between the one or more vertical fins and the substrate;
    replacing a portion of the bottom source/drain with a temporary gap filler; and
    replacing the temporary gap filler and temporary inner spacer with a wrap-around source/drain contact having an L-shaped cross-section.

2. The method of claim 1, further comprising forming a conductive source/drain contact to the wrap-around source/drain contact and the bottom source/drain, wherein there is less electrical resistance between the wrap-around source/drain contact and bottom source/drain compared to the conductive source/drain contact being directly on the bottom source/drain.

3. The method of claim 2, wherein the temporary gap filler and temporary inner spacer are the same material.

4. The method of claim 2, further comprising forming a bottom spacer layer on the wrap-around source/drain contact and the bottom source/drain.

5. The method of claim 4, further comprising forming a gate dielectric layer on the bottom spacer layer and the one or more vertical fins, and forming a conductive gate layer on the gate dielectric layer.

6. The method of claim 5, further comprising forming a top spacer layer on the conductive gate layer and the gate dielectric layer, and epitaxially growing a top source/drain on the one or more vertical fins.

7. The method of claim 5, further comprising conducting a reliability anneal on the gate dielectric layer before forming the wrap-around source/drain contact to avoid the degradation of silicides between the wrap-around source/drain contact and bottom source/drain.

8. The method of claim 7, wherein the wrap-around source/drain contact is on four sides and below an edge portion of the bottom source/drain that produces the L shaped cross-section.

9. The method of claim 7, wherein the wrap-around source/drain contact is made of a conductive metal selected from the group consisting of tungsten (W), aluminum (Al), copper (Cu), cobalt (Co), nickel (Ni), titanium (Ti), ruthenium (Ru), molybdenum (Mo), and combinations thereof.

10. A method of forming a vertical transport fin field effect transistor device, comprising:
    forming a plurality of vertical fins on a fin layer and a sacrificial exclusion layer, wherein the sacrificial exclusion layer is between the fin layer and a substrate;
    forming trenches through the fin layer, sacrificial exclusion layer, and into the substrate adjacent to one or more of the plurality of vertical fins;
    replacing a portion of a sacrificial exclusion layer with a temporary inner spacer;
    removing a portion of a fin layer and the sacrificial exclusion layer between the one or more vertical fins and the substrate;
    forming a bottom source/drain on the temporary inner spacer and the substrate;
    replacing a portion of the bottom source/drain with a temporary gap filler; and
    replacing the temporary gap filler and temporary inner spacer with a wrap-around source/drain contact having an L-shaped cross-section.

11. The method of claim 10, wherein the temporary gap filler and temporary inner spacer are the same material.

12. The method of claim 11, further comprising forming sidewall spacers on the plurality of vertical fins, and forming a masking plug on predetermined sidewall spacers to self-align the trenches to the plurality of vertical fins.

13. The method of claim 12, wherein the portion of a fin layer is removed using a selective lateral etch, and the bottom source/drain is formed by epitaxial growth on the exposed substrate surface.

14. The method of claim 13, further comprising forming a bottom spacer on the bottom source/drain.

15. A method of forming a vertical transport fin field effect transistor device, comprising:
    replacing a portion of a sacrificial exclusion layer between one or more vertical fins and a substrate with a temporary inner spacer;
    removing a portion of a fin layer and the sacrificial exclusion layer between the one or more vertical fins and the substrate;
    forming a bottom source/drain on the temporary inner spacer and between the one or more vertical fins and the substrate;
    replacing a portion of the bottom source/drain with a temporary gap filler, wherein the temporary gap filler does not extend laterally below the vertical fins; and
    replacing the temporary gap filler and temporary inner spacer with a wrap-around source/drain contact.

16. The method of claim 15, wherein the wrap-around source/drain contact is made of a conductive metal selected from the group consisting of tungsten (W), aluminum (Al), copper (Cu), cobalt (Co), nickel (Ni), titanium (Ti), ruthenium (Ru), molybdenum (Mo), and combinations thereof.

17. The method of claim 16, further comprising forming a conductive source/drain contact to the wrap-around source/drain contact and the bottom source/drain, wherein there is less electrical resistance between the wrap-around source/drain contact and bottom source/drain compared to the conductive source/drain contact being directly on the bottom source/drain.

18. The method of claim 17, further comprising forming a bottom spacer layer on the wrap-around source/drain contact and the bottom source/drain.

19. The method of claim 18, further comprising forming a gate dielectric layer on the bottom spacer layer and the one or more vertical fins, and forming a conductive gate layer on the gate dielectric layer.

20. The method of claim 19, wherein the sacrificial exclusion layer has a thickness in a range of about 5 nanometers (nm) to about 50 nm.

* * * * *